United States Patent
Nakayama et al.

(10) Patent No.: US 7,026,080 B2
(45) Date of Patent: Apr. 11, 2006

(54) POSITIVE PHOTOSENSITIVE POLYIMIDE RESIN COMPOSITION

(75) Inventors: Tomonari Nakayama, Chiba (JP); Masakazu Kato, Chiba (JP); Takayasu Nihira, Chiba (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 54 days.

(21) Appl. No.: 10/488,093

(22) PCT Filed: Sep. 18, 2002

(86) PCT No.: PCT/JP02/09559

§ 371 (c)(1),
(2), (4) Date: Mar. 5, 2004

(87) PCT Pub. No.: WO03/029899

PCT Pub. Date: Apr. 10, 2003

(65) Prior Publication Data

US 2004/0197699 A1   Oct. 7, 2004

(30) Foreign Application Priority Data

Sep. 26, 2001   (JP) ............................... 2001-293269

(51) Int. Cl.
*G03F 7/023*   (2006.01)
(52) U.S. Cl. ............................ 430/18; 430/20; 430/28; 430/191; 430/192; 430/193; 430/326
(58) Field of Classification Search ................ 430/191, 430/192, 193, 326, 20, 28, 330; 403/18
See application file for complete search history.

(56) References Cited

U.S. PATENT DOCUMENTS

| | | | |
|---|---|---|---|
| 5,288,588 A * | 2/1994 | Yukawa et al. | 430/192 |
| 6,677,099 B1 * | 1/2004 | Ishii et al. | 430/165 |
| 6,773,866 B1 * | 8/2004 | Sasaki et al. | 430/311 |
| 6,875,554 B1 * | 4/2005 | Hatanaka et al. | 430/270.1 |
| 2003/0194631 A1 * | 10/2003 | Suwa et al. | 430/151 |
| 2004/0175646 A1 * | 9/2004 | Hatanaka et al. | 430/270.1 |

FOREIGN PATENT DOCUMENTS

| | | |
|---|---|---|
| EP | 424940 | 5/1991 |
| EP | 863436 | 9/1998 |
| EP | 1 037 112 | 9/2000 |
| JP | 4-284455 | 10/1992 |
| JP | WO0140873 A1 * | 6/2001 |
| JP | 2001-183834 | 7/2001 |
| WO | 01/40873 | 6/2001 |
| WO | 01/75525 | 10/2001 |
| WO | 02/29494 | 4/2002 |

OTHER PUBLICATIONS

Patent Abstracts of Japan, JP 11-084653, Mar. 26, 1999.
Patent Abstracts of Japan, JP 04-284455, Oct. 9, 1992.

* cited by examiner

*Primary Examiner*—John S. Chu
(74) *Attorney, Agent, or Firm*—Oblon, Spivak, McClelland, Maier & Neustadt, P.C.

(57) ABSTRACT

The invention provides a positive photosensitive resin composition which is free from film reduction, swelling or peeling at the time of development with an aqueous alkaline solution and which provides a dimensionally stable patterns after curing, and of which the final cured film has a low water absorption and excellent alkaline resistance. A positive photosensitive polyimide resin composition characterized by comprising an organic solvent-soluble polyimide having repeating units represented by the formula (1):

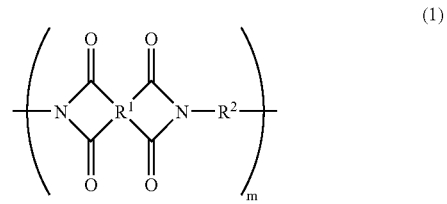

(wherein m is an integer of from 3 to 10,000, $R^1$ is a tetravalent organic group, $R^2$ is a bivalent organic group, provided that from 5 to 100 mol % of $R^2$ is a bivalent organic group having fluorine), a polyamic acid and a compound capable of generating an acid by irradiation with light.

20 Claims, No Drawings

POSITIVE PHOTOSENSITIVE POLYIMIDE RESIN COMPOSITION

TECHNICAL FIELD

The present invention relates to a photosensitive material suitable for a surface protective film, an interlayer insulating film, a passivation film, an electrode protecting layer, etc. for e.g. an electric or electronic device, particularly a semiconductor device or a display device, and particularly, it relates to a positive photosensitive polyimide resin composition capable of being developed with an aqueous alkaline solution.

BACKGROUND ART

As polyimide type positive photosensitive resin compositions, many have been reported wherein a quinonediazido compound is added to a polyamic acid or to a polyamic acid ester or polyimide having an acidic group in a side chain. However, a polyamic acid has a problem such that it is soluble too much in an alkali developer that film reduction at the time of the development is substantial, and it is necessary to use it by an addition of an amine or the like (U.S. Pat. No. 4,880,722). On the other hand, a polyimide (JP-A-3-115461) or polyamic acid ester (JP-A-64-60630) having an acidic group in a side chain is excellent in the developability, etc., but even after curing, acidic groups tend to remain in the polymer, whereby the final cured film was likely to have a high water absorption or its alkaline resistance was likely to substantially decrease. Further, with a positive photosensitive resin employing a resin mixture of a polyamic acid and a polyamic acid ester having an acidic group has a leaving component (Journal of Applied. Polymer Science, Vol. 51, P. 1971–1978), curing at a higher temperature is required to convert the polyamic acid ester to a polyimide, and film reduction by the curing tends to be substantial.

In recent years, use of photosensitive insulating films represented by photosensitive polyimide resins has been expanded not only to the semiconductor field but also to the display field. Accordingly, an excellent resolution free from film reduction or swelling in the formation of fine patterns, adhesion during the development, dimensional stability of the patterns in high temperature curing, etc. are now required, which have not been required for the conventional photosensitive polyimide resins. Among them, JP-A-2001-228609 has reported a positive photosensitive polyimide resin excellent in adhesion and developability, which comprises an alkali-soluble polyimide, a polyamic acid and an o-quinonediazido compound, but depending upon the combination of the polyimide and the polyamic acid, there has been a case where whitening of the film or the water absorption of the final cured film tends to be problematic.

Thus, the conventional positive photosensitive polyimide resins have had excellent properties respectively, but on the other hand, it has been difficult to develop a material which has both the lithographic properties and the properties for the final cured film and which provides patterns having high dimensional stability with little film reduction or swelling.

The present invention has been made in view of the above-described circumstances, and it is intended to provide a positive photosensitive resin composition which is free from film reduction, swelling or peeling at the time of the development with an aqueous alkaline solution and which provides patterns having high dimensional stability after curing, and of which the final cured film has a low water absorption and excellent alkaline resistance.

DISCLOSURE OF THE INVENTION

The present inventors have conducted an extensive study to solve the above problems and as a result, have arrived at the present invention.

Namely, the present invention relates to a positive photosensitive polyimide resin composition characterized by comprising an organic solvent-soluble polyimide having repeating units represented by the formula (1):

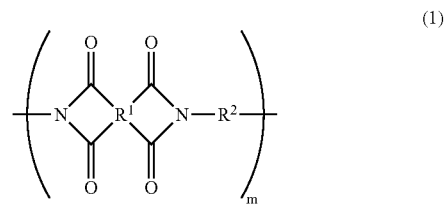

(wherein m is an integer of from 3 to 10,000, $R^1$ is a tetravalent-organic group, $R^2$ is a bivalent organic group, provided that from 5 to 100 mol % of $R^2$ is a bivalent organic group having fluorine), a polyamic acid having repeating units represented by the formula (2):

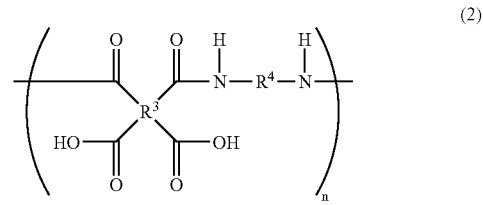

(wherein n is an integer of from 3 to 10,000, $R^3$ is a lo tetravalent organic group, and $R^4$ is a bivalent organic group), and a compound capable of generating an acid by irradiation with light.

BEST MODE FOR CARRYING OUT THE INVENTION

Now, the present invention will be described in detail.

The composition of the present invention comprises an organic solvent-soluble polyimide having repeating units represented by the above formula (1), a polyamic acid having repeating units represented by the above formula (2) and a compound capable of generating an acid by irradiation with light, whereby etching with an aqueous alkaline solution is easy, and a polyimide resin coating film having fine and dimensionally highly precise relief patterns can easily be obtained by exposure by means of a mask having prescribed patterns.

The method for obtaining the organic solvent-soluble polyimide having repeating units represented by the formula (1), is not particularly limited. Usually, it is obtained by reacting and polymerizing an organic tetracarboxylic acid or its derivative, which constitutes $R^1$ in the formula (1), with an organic diamine which constitutes $R^2$ in the formula (1). Particularly, a method is common wherein an organic tetracarboxylic dianhydride (hereinafter referred to simply as an acid anhydride) and an organic diamine (hereinafter referred to simply as a diamine) are reacted and polymerized to obtain a polyimide precursor, which is subjected to dehydration ring closure.

The acid anhydride which constitutes $R^1$ in the formula (1), is not particularly limited. Further, such acid anhydrides may be used alone or in combination as a mixture of two or more of them.

Specific examples thereof may, for example, be aromatic tetracarboxylic anhydrides such as pyromellitic anhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 3,3',4,4'-diphenylsulfonetetracarboxylic dianhydride and 2,2-bis(3,4-dicarboxyphenyl)hexafluoroisopropylidene dianhydride. From the viewpoint of the solubility, 3,3',4,4'-biphenyltetracarboxylic dianhydride, 3,3',4,4'-benzophenonetetracarboxylic dianhydride, 4,4'-hexafluoroisopropylidene diphthalic anhydride or 3,3',4,4'-diphenylsulfonetetracarboxylic dianhydride is, for example, preferred.

Further, alicyclic tetracarboxylic dianhydrides such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]octo-7-ene-2,3,5,6-tetracarboxylic dianhydride, 2,3,4,5-tetrahydrofurane tetracarboxylic dianhydride and 3,5,6-tricarboxy-2-norbornane acetic dianhydride, and aliphatic tetracarboxylic dianhydrides such as 1,2,3,4-butanetetracarboxylic dianhydride, may, for example, be mentioned.

$R^1$ in the formula (1) is a tetravalent organic group derived from a tetracarboxylic acid, and its structure is not particularly limited. Such organic groups may be of a single type or a mixture of two or more types. Specific examples thereof may, for example, be tetravalent organic groups (of a structure having two anhydride groups from tetracarboxylic dianhydrides) constituting the above-mentioned acid anhydrides.

Particularly, with a view to increasing the transparency and the solubility in an organic solvent of the solvent-soluble polyimide resin having repeating units represented by the formula (1), a case where four carbonyl groups bonded to $R^1$ are not directly bonded to an aromatic ring, or a case where $R^1$ is a tetravalent organic group constituting an aromatic tetracarboxylic acid having fluorine, is preferred. In order to obtain such a polyimide resin having high transparency and solubility, the acid anhydride which constitutes $R^1$ in the formula (1) is preferably a tetracarboxylic dianhydride comprising four carbonyl groups not directly bonded to an aromatic ring, such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]octo-7-ene-2,3,5,6-tetracarboxylic dianhydride, 2,3,4,5-tetrahydrofurane tetracarboxylic dianhydride or 3,5,6-tricarboxy-2-norbornane acetic dianhydride, or an aromatic dianhydride containing fluorine, such as 4,4'-hexafluoroisopropylidene diphthalic anhydride. Likewise, as preferred specific examples for $R^1$, tetravalent organic groups constituting the above-mentioned acid anhydrides may be mentioned.

Diamines which constitute $R^2$ in the formula (1) may be of a single type or a combination of two or more types, and they are not particularly limited so long as at least 5 mol % of the diamine component to be used, is a diamine having fluorine. By using from 5 to 100 mol % of a diamine having fluorine, from 5 to 100 mol % of $R^2$ contained in the finally obtainable polyimide will be a bivalent organic group having fluorine. Fluorine is effective not only to increase the solubility of the organic solvent-soluble polyimide but also to improve the compatibility with a polyamic acid. If the diamine component having fluorine is less than 5 mol %, i.e. if $R^2$ having fluorine in the formula (1) is less than 5 mol %, the compatibility with a polyamic acid is likely to deteriorate, whereby the solution tends to be turbid, or even if the solution will not be turbid, the surface of a cast film tends to undergo whitening. It is particularly preferred that from 0 to 100 mol % of $R^2$ is a bivalent organic group having fluorine, and as a diamine to be used, it is preferred that from 50 to 100 mol % is a diamine having fluorine.

Fluorine in the diamine is usually introduced in the form of e.g. a fluoro group or a fluoroalkyl group directly bonded to a benzene ring and may be a singular or plural number. Particularly, from the viewpoint of the compatibility with a polyamic acid, a diamine having a trifluoromethyl group or a hexafluoroisopropylidene group, is preferred. Such diamines having fluorine may be used in a single type or in combination of two or more types.

Specific examples of the diamine having a trifluoromethyl group or a hexafluoroisopropylidene group, may, for example, be 2,2'-bis(trifluoromethyl)benzidine, 2,6,2',6'-tetrakis(trifluoromethyl)benzidine, 2,2-bis[4-(3-aminophenoxy)phenyl]hexafluoropropane, 2,2-bis[4-(4-aminophenoxy)phenyl]hexafluoropropane, 2,2-bis(4-anilino)hexafluoropropane, 2,2-bis(3-anilino)hexafluoropropane and 2,2-bis(3-amino-4-toluyl)hexafluoropropane.

$R^2$ in the formula (1) is a bivalent organic group derived from a diamine, and its structure is not particularly limited, so long as from 5 to 100 mol % of $R^2$ is a bivalent organic group having fluorine. Further, $R^2$ may be of a single type or a mixture of two or more types. And, $R^2$ having fluorine is preferably a bivalent organic group having a trifluoromethyl group or a hexafluoroisopropylidene group, and as its specific example, a bivalent organic group (of a structure having two primary amino groups removed from a diamine) constituting the above-mentioned diamine having a trifluoromethyl group or a hexafluoroisopropylidene group.

As the diamine which constitutes $R^2$ in the above formula (1), a diamine having no fluorine may be used within a range of from 0 to 95 mol %, preferably from 0 to 50 mol %.

The diamine having no fluorine may, for example, be an aromatic diamine such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,41-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3- bis(3-aminophenoxy)benzene, bis[4-(4-aminophenoxy) phenyl]sulfone, bis[4-(3-aminophenoxy)phenyl]sulfone, 2,2-bis[4-(4-aminophenoxy)phenyl]propane or 2,2-bis[4-(3-aminophenoxy)phenyl]propane, or an aliphatic diamine such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane or 4,4'-diamino-3,3'-dimethyldicyclohexylmethane. Such diamines having no fluorine may be used in a single type or in combination of two or more types.

Specific examples of $R^2$ having no fluorine may be bivalent organic groups constituting the above-mentioned diamines having no fluorine. They may be used in a single type or in combination of two or more types within a range of from 0 to 95 mol %, preferably from 0 to 50 mol %, as mixed to $R^2$ of the formula (1).

Further, $R^2$ in the formula (1) may have an acidic group, and such acidic groups may be of one type or a mixture of two or more types. Accordingly, as the diamine which constitutes $R^2$ in the formula (1), a diamine having an acidic group may be used. The acidic group may, for example, be a phenolic hydroxyl group, a carboxylic acid, a sulfoneamide group or a sulfonic acid, but as an acidic group for a positive photosensitive polymer, a carboxylic acid and a phenolic hydroxyl group are most common. The organic solvent-soluble polyimide having no acidic group is insoluble in an alkali developer, but by introducing an acidic group, the affinity to the alkali developer will be increased, and if such an acid group is contained to some extent, the dissolution rate in an alkali developer of a film obtainable from the organic solvent-soluble polyimide, will increase, whereby the time for development of the positive photosensitive polyimide resin composition of the present invention can be shortened. However, acidic groups in the polyimide tend to deteriorate the alkaline resistance of the finally cured film or the film properties such as hygroscopic properties. Accordingly, $R^2$ having an acidic group in the formula (1) is preferably at most 10 mol %. In other words, from 90 to 100 mol % of $R^2$ is preferably a bivalent organic group having no acidic group. Thus, the diamine having an acidic group in the diamine which constitutes $R^2$ in the formula (1) is preferably at most 10 mol %. If it is more than 10 mol %, the remaining acidic groups tend to deteriorate the alkaline resistance of the finally cured film or the film properties such as hygroscopic properties.

The positive photosensitive polyimide resin composition of the present invention makes it possible to obtain a high contrast between an exposed area and an unexposed area by a combination of an organic solvent-soluble polyimide having a low alkali affinity and a polyamic acid having a very high alkali affinity. Accordingly, the organic solvent-soluble polyimide represented by the formula (1) preferably has a dissolution rate of at most 0.1 μm/min in a 2.38 wt % tetramethyl ammonium hydroxide aqueous solution at 23° C. If the dissolution rate is faster than 0.1 μm/min, not only the contrast deteriorates, but also the sensitivity deteriorates.

The diamine having an acidic group includes a diamine which simultaneously has fluorine. Further, $R^2$ having an acidic group may be a bivalent organic group which has an acidic group and fluorine simultaneously. In such a case, both the above-mentioned effect having fluorine and the effect having an acidic group will be provided.

With respect to specific examples of the diamine and $R^2$ having an acidic group, as a diamine which simultaneously has fluorine, a diamine having a phenolic hydroxyl group such as 2,2-bis(3-amino-4-hydroxyphenyl)hexafluoropropane, 2,2-bis(4-amino-3-hydroxyphenyl)hexafluoropropane, 2,2-bis(4-amino-3,5-dihydroxyphenyl)hexafluoropropane or 2,2-bis[4-(3-amino-4-hydroxyphenoky)phenyl] hexafluoropropane, or a diamine having a carboxyl group such as 2,2-bis[4-(4-amino-3-carboxyphenoxy)phenyl] hexafluoropropane may be mentioned; as $R^2$ which simultaneously has an acidic group and fluorine, polyvalent organic groups constituting these diamines may be mentioned; as the diamine which has an acidic group and no fluorine, a diamine having a phenolic hydroxyl group such as 2,4-diaminophenol, 3,5-diaminophenol, 2,5-diaminophenol, 4,6-diaminoresorcinol, 2,5-diaminohydroquinone, bis (3-amino-4-hydroxyphenyl)ether, bis(4-amino-3-hydroxyphenyl)ether, bis(4-amino-3,5-dihydroxyphenyl)ether, bis (3-amino-4-hydroxyphenyl)methane, bis(4-amino-3-hydroxyphenyl)methane, bis(4-amino-3,5-dihydroxyphenyl)methane, bis(3-amino-4-hydroxyphenyl)sulfone, bis(4-amino-3-hydroxyphenyl)sulfone, bis(4-amino-3,5-dihydroxyphenyl)sulfone, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy) benzene, 1,3-bis(3-amino-4-hydroxyphenoxy)benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone or bis[4-(3-amino-4-hydroxyphenoxy)phenyl] propane, or a diamine having a carboxyl group such as 2,4-diaminobenzoic acid, 2,5-diaminobenzoic acid, 3,5-diaminobenzoic acid, 4,6-diamino-1,3-benzenedicarboxylic acid, 2,5-diamino-1,4-benzenedicarboxylic acid, bis(4-amino-3-carboxyphenyl)ether, bis(4-amino-3,5-dicarboxyphenyl)ether, bis(4-amino-3-carboxyphenyl)sulfone, bis(4-amino-3,5-dicarboxyphenyl) sulfone, 4,4'-diamino-3,3'-dicarboxybiphenyl, 4,4'-diamino-3,3'-dicarboxy-5,5'-dimethylbiphenyl, 4,4'-diamino-3,3'-dicarboxy-5,5'-dimethoxybiphenyl, 1,4-bis(4-amino-3-carboxyphenoxy)benzene, 1,3-bis(4-amino-3-carboxyphenoxy)benzene, bis[4-(4-amino-3-carboxyphenoxy)phenyl]sulfone or bis[4-(4-amino-3-carboxyphenoxy)phenyl]propane, may be mentioned; and as $R^2$ which has an acidic group and no fluorine, bivalent organic groups constituting such diamines may be mentioned. Diamines having such acidic groups may be used alone or in combination as a mixture of two or more of them.

Further, from the viewpoint of adhesion of polyimide as the final cured film, a polyimide having a siloxane structure for $R^2$ in the formula (1) is preferred, and in order to obtain such a polyimide, it is preferred to employ a diamine constituting $R^2$ in the formula (1) in combination with a siloxane-containing diamine, but the present invention is not limited thereto. Further, from the viewpoint of the water absorption of the final cured film, $R^2$ having a siloxane structure is preferably at most 10 mol %, and likewise, the amount of the siloxane-containing diamine is preferably at most 10 mol %.

The siloxane-containing diamine is preferably a siloxane-containing diamine represented by the formula (3):

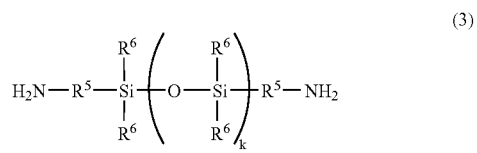

(wherein $R^5$ is a bivalent organic group, $R^6$ is a monovalent organic group, and k is an integer of at least 1.)

As preferred specific examples for $R^2$ having a siloxane structure, bivalent organic groups which constitute the above-mentioned siloxane-containing diamines, may be mentioned. The reaction to form a polyimide precursor from an acid anhydride and a diamine, is usually carried out in a polar solvent such as N-methylpyrrolidone, dimethylacetamide, γ-butyrolactone or diglyme. The polar solvent to be used here, is not particularly limited so long as it is one capable of dissolving the polyimide precursor. The reaction temperature of the tetracarboxylic dianhydride with the diamine can be selected to be an optional temperature from −20 to 150° C., preferably from −5 to 100° C.

To convert the polyimide precursor to a polyimide, the polyimide precursor may be heated to a temperature of from 150° C. to 250° C. in a solution state, and in order to remove water formed by dehydration ring closure, it is possible, for example, to add toluene or xylene, followed by azeotropic dehydration.

Further, catalytic imidation may be mentioned as a simple method to convert the polyimide precursor to a polyimide. In this case, acetic anhydride and a tertiary amine such as triethylamine, pyridine, isoquinoline or imidazole, are added to the polyimide precursor, and imidation may be carried out at an optional temperature of from 0° C. to 200° C. This method is known to be an effective method to convert a polyamic acid to a polyimide, since it requires no particular heating or no cumbersome operation to remove water formed by dehydration ring closure. However, in the case of a polyimide resin containing hydroxyl groups, the hydroxyl groups are likely to react with highly reactive acetic anhydride, and thus, this method is known to have a drawback that in such a case, this method can not be employed.

The repeating number m of the organic solvent-soluble polyimide having repeating units represented by the formula (1) is an integer of at least 3 and at most 10,000. If m is smaller than 3, the mechanical strength of a film formed by the obtained composition tends to be low, and if m is larger than 10000, the compatibility with the polyamic acid tends to substantially deteriorate. Further, a usual polyimide obtained by a polymerization reaction is a collection of molecules having different polymerization degrees, and the average value of the repeating number m of the organic solvent-soluble polyimide having repeating units represented by the formula (1), to be used in the present invention, is preferably from 10 to 1000, more preferably from 15 to 100.

A method for obtaining a polyamic acid having repeating units represented by the formula (2) of the present invention, is not particularly limited.

Usually, it can be obtained by a method wherein an organic tetracarboxylic dianhydride which constitutes $R^3$ in the formula (2) (hereinafter referred to simply as an acid anhydride) and an organic diamine which constitutes $R^4$ in the formula (2) (hereinafter referred to simply as a diamine) are reacted and polymerized.

The acid anhydride which constitutes $R^3$ in the formula (2) is not particularly limited. Further, such anhydrides may be used alone or in combination as a mixture of two or more of them. As specific examples thereof, aromatic tetracarboxylic dianhydrides such as pyromellitic anhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 3,3',4,4'-diphenylsulfone-tetracarboxylic dianhydride and 4,4'-hexafluoroisopropylidenediphthalic anhydride may, for example, be mentioned.

Further, an alicyclic tetracarboxylic dianhydride such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane succinic dianhydride, bicyclo[2.2.2]octo-7-ene-2,3,5,6-tetracarboxylic dianhydride, 2,3,4,5-tetrahydrofuranetetracarboxylic dianhydride or 3,5,6-tricarboxy-2-norbornane acetic dianhydride, or an aliphatic tetracarboxylic dianhydride such as 1,2,3,4-butanetetracarboxylic dianhydride, may be mentioned.

$R^3$ in the formula (2) is a tetravalent organic group derived from a tetracarboxylic acid, and its structure is not particularly limited. Such organic groups may be of one type or a mixture of two or more types. And, specific examples thereof may be tetravalent organic groups which constitute the above-mentioned acid anhydrides.

The diamine which constitutes $R^4$ in the formula (2) is not particularly limited. Further, such diamines may be used alone or in combination as a mixture of two or more of them.

Specific examples thereof may be aromatic diamines such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(3-aminophenoxy)phenyl]propane, 2,2-bis[4-(3-aminophenoxy)phenyl]hexafluoropropane, 2,2-bis(4-anilino)hexafluoropropane, 2,2-bis(3-anilino)hexafluoropropane and 2,2-bis(3-amino-4-toluyl)hexafluoropropane. Further, aliphatic diamines such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane and 4,4'-diamino-3,3'-dimethyldicyclohexylmethane, may be mentioned.

$R^4$ in the formula (2) is a bivalent organic group derived from a diamine, and its structure is not particularly limited. Such organic groups may be of one type or a mixture of two or more types. Accordingly, specific examples thereof may be bivalent organic groups which constitute the above-mentioned diamines.

Further, from the viewpoint of the adhesion of a polyimide as the final cured film, a polyamic acid having a siloxane structure for $R^4$ in the formula (2) is preferred, and in order to obtain such a polyimide, it is preferred to employ also a siloxane-containing diamine in combination, as the diamine which constitutes $R^4$ in the formula (2), but the present invention is not limited thereto. Further, from the viewpoint of the water absorption of the final cured film, $R^4$ having a siloxane structure is preferably at most 10 mol %, and likewise, the amount of the siloxane-containing diamine is preferably at most 10 mol %.

As the siloxane-containing diamine, a siloxane-containing diamine represented by the formula (3):

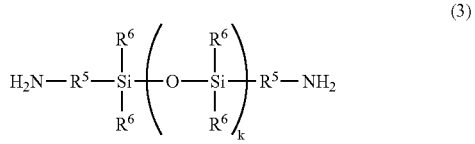

(wherein $R^5$ is a bivalent organic group, $R^6$ is a monovalent organic group, and k is an integer of at least 1) is preferred.

A preferred specific example of $R^4$ having a siloxane structure may be a bivalent organic group which constitutes the above-mentioned siloxane-containing diamine.

As described above, in the polyamic acid having repeating units represented by the formula (2), the structures of $R^3$ and $R^4$ are not particularly limited, but from the viewpoint of the water absorption of the final cured film, it is preferred that at least one of $R^3$ and $R^4$ has fluorine. In order to obtain such a polyamic acid, an acid anhydride having fluorine may be used as the acid anhydride which constitutes $R^3$ in the formula (2), or a diamine having fluorine may be used as the diamine which constitutes R in the formula (2). As a specific example of the acid anhydride having fluorine, 4,4'-hexafluoroisopropylidene diphthalic anhydride may be mentioned, and as the diamine having fluorine, 2,2'-bis(trifluoromethyl)benzidine, 2,6,2',6'-tetrakis(trifluoromethyl)benzidine, 2,2-bis[4-(3-aminophenoxy)phenyl]hexafluoropropane, 2,2-bis[4-(4-aminophenoxy)phenyl] hexafluoropropane, 2,2-bis(4-anilino)hexafluoropropane, 2,2-bis(3-anilino)hexafluoropropane or 2,2-bis(3-amino-4-toluyl)hexafluoropropane may be mentioned. As a preferred example of $R^3$ having fluorine, a tetravalent organic group constituting the above-mentioned acid anhydride having fluorine may be mentioned, and as a preferred example of $R^4$ having fluorine, a bivalent organic group constituting the above-mentioned diamine having fluorine may be mentioned.

With respect to the preferred contents of $R^3$ having fluorine and $R^4$ having fluorine in the formula (2), $R^3$ having fluorine to the total $R^3$ is preferably from 50 to 100 mol %, or $R^4$ having fluorine to the total $R^4$ is from 50 to 100 mol %, or the sum of the molar ratio of $R^3$ having fluorine to the total $R^3$ and the molar ratio of $R^4$ having fluorine to the total $R^4$, is from 50 to 100 mol %. If the sum of the molar ratio of $R^3$ having fluorine to the total $R^3$ and the molar ratio of $R^4$ having fluorine to the total $R^4$, is larger than 100 mol %, wettability to a substrate tends to be poor when used as a coating fluid, and uniformity of the coating film or adhesion to the substrate tends to be poor.

The reaction to obtain a polyamic acid from an acid anhydride and a diamine is carried out usually in a polar solvent such as N-methylpyrrolidone, dimethylacetamide, γ-butyrolactone or diglyme. The polar solvent to be used here, is not particularly limited so long as it is one capable of dissolving the polyimide precursor. The reaction temperature of the tetracarboxylic dianhydride with the diamine can be selected to be an optional temperature from −20 to 150° C., preferably from −5 to 100° C.

In the present invention, the repeating number n of the polyamic acid having repeating units represented by the formula (2) is an integer of from 3 to 10000. If n is smaller than 3, the mechanical strength of a film to be formed by the obtained composition tends to be low, and if n is larger than 10000, the compatibility with a solvent-soluble polyimide tends to be very low. Further, a polyimide obtainable by a usual polymerization reaction is a collection of molecules having different polymerization degrees, and accordingly, the average value of the repeating number m of the organic solvent-soluble polyimide having repeating units represented by the formula (2) to be used in the present invention is preferably from 10 to 1000, more preferably from 15 to 100.

In the present invention, the compound capable of generating an acid by irradiation with light, is not particularly limited so long as it is one which is capable of generating an acid by a photoreaction and which has a function to increase the solubility of the irradiated portion in an alkali developer. Further, such compounds may be used alone or in combination as a mixture of two or more of them.

Specific examples thereof may, for example, be an o-quinonediazide compound, an allyl diazonium salt, a diallyl iodonium salt, a triallyl sulfonium salt, an o-nitrobenzyl ester, a p-nitrobenzyl ester, a trihalomethyl group-substituted s-triazine derivative and an imide sulfonate derivative. Further, a sensitizing agent may be used in combination, as the case requires. The sensitizing agent may, for example, be perylene, anthracene, thioxanthene, Micheler's ketone, benzophenone or fluorine.

Among such compounds capable of generating acids by irradiation with light, an o-quinonediazide compound is preferred from the viewpoint of the sensitivity and resolving power.

Usually, the o-quinonediazide compound is used in the form of an o-quinonediazide sulfonic acid ester or an o-quinonediazide sulfone amide, obtainable by a condensation reaction of an o-quinonediazidesulfonyl chloride with a compound having a hydroxyl group or a compound having an amino group in the presence of a basic catalyst.

As the o-quinonediazide sulfonic acid component which constitutes the above o-quinonediazidesulfonyl chloride, 1,2-naphthoquinone-2-diazido-4-sulfonic acid, 1,2-naphthoquinone-2-diazido-5-sulfonic acid or 1,2-naphthoquinone-2-diazido-6-sulfonic acid, may, for example, be mentioned.

The above compound having a hydroxyl group, may, for example, be a phenol compound such as phenol, o-cresol, m-cresol, p-cresol, hydroquinone, resorcinol, catechol, 4,4-isopropylidenediphenol, 1,1-bis(4-hydroxyphenyl)cyclohexane, 4,4'-dihydroxyphenylsulfone, 4,4-hexafluoroisopropylidenediphenol, 4,4',4''-trihydroxytriphenylmethane, 1,1,1-tris(4-hydroxyphenyl)ethane, 4,4'-[1-[4-[1-(4-hydroxyphenyl)-1-methylethyl]phenyl]ethylidene]bisphenol, 2,4-dihydroxybenzophenone, 2,3,4-trihydroxybenzophenone, 2,2',4,4'-tetrahydroxybenzophenone, 2,3,4,4'-tetrahydroxybenzophenone or 2,3,4,2',4'-pentahydroxybenzophenone, or an aliphatic alcohol such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate or butyl lactate.

Further, an aniline such as aniline, o-toluidine, m-toluidine, p-toluidine, 4-aminodiphenylmethane, 4-aminodiphenyl, o-phenylenediamine, m-phenylenediamine, p-phenylenediamine, 4,4'-diaminodiphenylmethane or 4,4'-diaminodiphenylether, or aminocyclohexane, may be mentioned.

Further, as the compound having both a hydroxyl group and an amino group, an aminophenol such as o-aminophenol, m-aminophenol, p-aminophenol, 4-aminoresorcinol, 2,3-diaminophenol, 2,4-diaminophenol, 4,4'-diamino-4"-hydroxytriphenylmethane, 4-amino-4',4"-dihydroxytriphenylmethane, bis(4-amino-3-carboxy-5-hydroxyphenyl) ether, bis(4-amino-3-carboxy-5-hydroxyphenyl)methane, bis(4-amino-3-carboxy-5-hydroxyphenyl)sulfone, 2,2-bis (4-amino-3-carboxy-5-hydroxyphenyl)propane or 2,2-bis(4-amino-3-carboxy-5-hydroxyphenyl)hexafluoropropane, or an alkanol amine such as 2-aminoethanol, 3-aminopropanol or 4-aminocyclohexanol, may be mentioned.

It is common to employ such compounds in the form of di-substituted compounds, tri-substituted compounds, tetra-substituted compounds or penta-substituted compounds having part or all of hydroxyl groups or amino groups of such compounds substituted by the above o-quinonediazido sulfonic acid groups, or in the form of a mixture thereof.

In the positive photosensitive polyimide resin composition of the present invention, the incorporated amounts of the organic solvent-soluble polyimide having repeating units represented by the formula (1) and the polyamic acid having repeating units represented by the formula (2), are preferably such that the latter is from 5 to 400 parts by weight per 100 parts by weight of the former, from the viewpoint of the sensitivity, resolving power and developability. If the polyamic acid per 100 parts by weight of the organic solvent-soluble polyimide is less than 5 parts by weight, the developability of the exposed area of the positive photosensitive resin composition film tends to be poor, and not only the contrast between the exposed area and the unexposed area tends to be small, but the sensitivity tends to deteriorate. On the other hand, if the polyamic acid per 100 parts by weight of the organic solvent-soluble polyimide exceeds 400 parts by weight, the developer resistance of the exposed area of the positive photosensitive resin composition film tends to be extremely low, whereby the film reduction of the pattern after the development tends to be substantial, and the resolving power will also decrease. It is particularly preferred that the polyamic acid per 100 parts by weight of the organic solvent-soluble polyimide, is from 50 to 200 parts by weight.

Further, from the viewpoint of the sensitivity and the resolving power of the positive photosensitive polyimide resin composition and the characteristics of the film after baking, the compound capable of generating an acid by irradiation with light, is preferably from 1 to 50 parts by weight per 100 parts by weight of the total amount of the above organic solvent-soluble polyimide and the polyamic acid. If the compound capable of generating an acid by irradiation with light per 100 parts by weight of the total amount of the organic solvent-soluble polyimide and the polyamic acid, is less than 1 part by weight, the solubility in an alkali developer of the exposed area of the positive photosensitive resin composition film tends to be inadequate, whereby the contrast between the exposed area and the unexposed area tends to be small. On the other hand, if the compound capable of generating an acid by irradiation with light per 100 parts by weight of the total amount of the organic solvent-soluble polyimide and the polyamic acid, exceeds 50 parts by weight, the mechanical properties of a cured film obtained by treating the positive photosensitive resin composition film at a high temperature, tends to deteriorate. Especially, the compound capable of generating an acid by irradiation with light is preferably from 10 to 40 parts by weight, per 100 parts by weight of the total amount of the organic solvent-soluble polyimide and the polyamic acid.

When employed for an electric or electronic device, the positive photosensitive polyimide resin composition of the present invention is used in the form of a solution as dissolved in an organic solvent. Such an organic solvent is not particularly limited so long as it is one wherein the polyimide, the polyamic acid and the compound capable of generating an acid by irradiation with light can be uniformly dissolved, and such components are compatibly soluble. Specific examples thereof may, for example, be N,N-dimethylformamide, N,N-dimethylacetamide, N-methyl-2-pyrrolidone, N-vinyl pyrrolidone, dimethylsulfoxide, γ-butyrolactone and cyclohexanone.

Further, another organic solvent may be used in combination as the case requires, so long as the present composition can be uniformly dissolved. Specific examples of such an organic solvent may, for example, be 2-methoxyethanol, 2-ethoxyethanol, 2-butoxyethanol, 2-methoxyethyl acetate, 2-methoxy-1-propanol, 3-methoxypropyl acetate, ethyl lactate, butyl lactate, ethyl cellosolve, butyl cellosolve, ethyl carbitol, butyl carbitol, ethyl carbitol acetate, butyl carbitol acetate and ethylene glycol.

As a method to obtain a solution of the positive photosensitive polyimide resin composition of the present invention, a solution of the polyamic acid having repeating units represented by the formula (2) and the compound capable of generating an acid by irradiation with light may be dissolved in a solution having the organic solvent-soluble polyimide having repeating units represented by the formula (1) reacted and polymerized, or the organic solvent-soluble polyimide resin having repeating units represented by the formula (1), precipitated and recovered by means of a poor solvent, and the polyamic acid having repeating units represented by the formula (2) may be dissolved in the above-mentioned organic solvent, together with the compound capable of generating an acid by irradiation with light.

The concentration of the above resin composition solution is not particularly limited so long as the respective components are uniformly dissolved. From the efficiency in processing, it is usually preferably used within a range of from 1 to 50 wt %, particularly preferably from 5 to 30 wt %.

The positive photosensitive polyimide resin composition of the present invention may further contain an organic silane compound or an aluminum chelate compound in order to improve the adhesion to the substrate of a cured film.

The organic silane compound may, for example, be vinyl triethoxysilane, 3-glycidoxypropyltriethoxysilane, 3-methacryloxypropyltrimethoxysilane or 3-aminopropyltriethoxysilane. The aluminum chelate compound may, for example, be tris(acetyl acetonate)aluminum or acetyl acetate aluminum diisopropylate.

The solution of the positive photosensitive polyimide resin composition of the present invention may be spin-coated on a substrate such as a silicon wafer, an oxide film or a nitride film, followed by preliminary drying at a temperature of from 80 to 130° C. to form a film.

On the above film, a mask having a prescribed pattern in mounted, and a light is irradiated, followed by development with an alkali developer, whereby the exposed area is washed off to obtain a relief pattern having a sharp edge surface. The developer to be used here may be any developer so long as it is an aqueous alkaline solution, and an aqueous solution of an alkali metal hydroxide such as potassium hydroxide, sodium hydroxide, potassium carbonate or sodium carbonate, an aqueous solution of a quaternary ammonium hydroxide such as tetramethyl ammonium hydroxide, tetraethyl ammonium hydroxide or an aqueous solution of an amine such as ethanolamine, propylamine or ethylene diamine, may, for example, be mentioned.

The above alkali developer is usually an aqueous solution of at most 10 wt %, preferably an aqueous solution of from 0.5 to 3.0 wt %. Further, to the above developer, an alcohol and a surfactant may be added for use. They may, respectively, be incorporated preferably within a range of from 0.05 to 10 parts by weight, per 100 parts by weight of the developer.

With the present composition, the solubility of the exposed area is high, and the above development can easily be carried out at room temperature.

The substrate having a relief pattern thus obtained, is subjected to heat treatment at a temperature of from 180 to 400° C., whereby it is possible to obtain a polyimide coating film having a good relief pattern, which is excellent in heat resistance, chemical resistance and electrical characteristics.

The composition of the present invention has positive photosensitive characteristics with high sensitivity and high resolution, whereby etching with an aqueous alkaline solution is easy, and by exposure by means of a mask having a prescribed pattern, a polyimide resin coating film having a relief pattern having a fine shape and high dimensional precision, can easily be obtained.

The positive photosensitive polyimide resin composition of the present invention may be used for e.g. an interlayer insulating film for a semiconductor element, a passivation film, a buffer coating film or an insulating film for a multilayer printed circuit board. Further, it may also be used for a protective film for a thin film transistor of a liquid crystal display device, or a protective film for electrodes for an inorganic EL device.

Now, the present invention will be described in further detail with reference to Examples. However, it should be understood that the present invention is by no means restricted thereto.

PREPARATION EXAMPLE 1

Preparation of Organic Solvent-Soluble Polyimide (1)

16.30 g (0.045 mol) of 2,2'-bis(3-amino-4-toluyl) hexafluoropropane (hereinafter referred to simply as BIS-AT-AF), 0.76 g (0.005 mol) of 3,5-diamino benzoic acid (hereinafter referred to simply as DABA) and 9.81 g (0.050 mol) of cyclobutanetetracarboxylic dianhydride (hereinafter referred to simply as CBDA) were dissolved in 62.70 g of N-methyl-2-pyrrolidone (hereinafter referred to simply as NMP), and a reaction was carried out at room temperature for 24 hours.

To the reaction solution, 246.30 g of NMP, 51.05 g (0.500 mol) of acetic anhydride and 39.55 g (0.300 mol) of pyridine were added, and a dehydration ring closure reaction was carried out at 40° C. for 3 hours. This solution was put into pure water, followed by filtration and drying to obtain 23.70 g of a powdery organic solvent-soluble polyimide (1) having a number average molecular weight of 26,100 as calculated as polyethylene oxide (the average of repeating units was about 49).

The polyimide (1) was dissolved in NMP, directly coated on a silicon wafer by means of a spin coater and heated at 120° C. for two minutes on a hotplate to obtain a coating film having a thickness of about 2.0 µm. This coating film was immersed in a 2.38 wt % tetramethylammonium hydroxide aqueous solution (hereinafter referred to as TMAH) at 23° C. for from 60 to 180 seconds, whereby the dissolution rate was measured and found to be 0.06 µm/min.

PREPARATION EXAMPLE 2

Preparation of Organic Solvent-Soluble Polyimide (2)

15.76 g (0.044 mol) of BIS-AT-AF, 0.61 g (0.004 mol) of DABA, 0.62 g (0.002 mol) of bis(3-aminopropyl)-1,1,3,3-tetramethyldisiloxane (hereinafter referred to simply as APDS) and 9.81 g (0.050 mol) of CBDA were dissolved in 62.53 g of NMP, and a reaction was carried out at room temperature for 24 hours.

To the reaction solution, 245.67 g of NMP, 51.05 g (0.500 mol) of acetic anhydride and 39.55 g (0.300 mol) of pyridine were added, and a dehydration ring closure reaction was carried out at 40° C. for 3 hours. This solution was put into pure water, followed by filtration and drying to obtain 27.55 g of a powdery organic solvent-soluble polyimide (2) having a number average molecular weight of 21,200 as calculated as polyethylene oxide (the average of repeating units was about 40). The dissolution rate of the polyimide (2) was measured in the same manner as in Preparation Example 1 and found to be 0.05 µm/min.

PREPARATION EXAMPLE 3

Preparation of Organic Solvent-Soluble Polyimide (3)

18.12 g (0.050 mol) of BIS-AT-AF and 9.81 g (0.050 mol) of CBDA were dissolved in 65.17 g of NMP, and a reaction was carried out at room temperature for 24 hours.

To the reaction solution, 256.03 g of NMP, 51.05 g (0.500 mol) of acetic anhydride and 39.55 g (0.300 mol) of pyridine were added, and a dehydration ring closure reaction was carried out at 40° C. for 3 hours. This solution was put into pure water, followed by filtration and drying to obtain 23.18 g of a powdery organic solvent-soluble polyimide (3) having a number average molecular weight of 26,000 (the average of repeating units was about 47). The dissolution rate of the polyimide (3) was measured in the same manner as in Preparation Example 1 and found to be 0.00 µm/min.

PREPARATION EXAMPLE 4

Preparation of Organic Solvent-Soluble Polyimide (4)

16.01 g (0.050 mol) of 2,2'-bis(trifluoromethyl)benzidine (hereinafter referred to simply as TFMB) and 13.21 g (0.050 mol) of 5-(2,5-dioxotetrahydrofuryl)-3-methyl-3-cyclohexene-1,2-dicarboxylic dianhydride were dissolved in 68.18 g of NMP, and a reaction was carried out at room temperature for 36 hours.

To the reaction solution, 267.85 g of NMP, 51.05 g (0.500 mol) of acetic anhydride and 39.55 g (0.300 mol) of pyridine were added, and a dehydration ring closure reaction was carried out at 40° C. for 3 hours. This solution was put into pure water, followed by filtration and drying to obtain 26.30 g of a powdery organic solvent-soluble polyimide (4) having a number average molecular weight of 15,900 as calculated as polyethylene oxide (the average of repeating units was about 27). The dissolution rate of the polyimide (4) was measured in the same manner as in Preparation Example 1 and found to be 0.00 µm/min.

PREPARATION EXAMPLE 5

Preparation of Organic Solvent-Soluble Polyimide (5)

15.14 g (0.035 mol) of bis[4-(3-aminophenoxy)phenyl] sulfone, 2.28 g (0.015 mol) of DABA and 9.61 g (0.049 mol) CBDA were reacted in 153.17 g of NMP at room temperature for 6 hours.

To the reaction solution, 157.67 g of NMP, 51.05 g (0.500 mol) of acetic anhydride and 39.55 g (0.300 mol) of pyridine were added, and a dehydration ring closure reaction was carried out at 40° C. for 3 hours. This solution was put into pure water, followed by filtration and drying to obtain 24.33 g of a powdery organic solvent-soluble polyimide (5) having a number average molecular weight of 36,000 as calculated as polyethylene oxide (the average of repeating units was about 66). The dissolution rate of the polyimide (5) was measured in the same manner as in Preparation Example 1 and found to be 0.20 µm/min.

PREPARATION EXAMPLE 6

Preparation of Polyamic Acid solution (6)

15.21 g of TFMB, 0.62 g of APDS and 14.42 g of 3,3',4,4'-biphenyltetracarboxylic dianhydride (hereinafter referred to simply as BPDA) were reacted in 171.41 g of NMP at room temperature for 12 hours, to obtain an NMP solution of a polyamic acid (6). The number average molecular weight was 19,500 as calculated as polyethyleneoxide (the average of repeating units was about 32).

PREPARATION EXAMPLE 7

Preparation of Polyamic Acid Solution (7)

15.21 g of TFMB, 0.62 g of APDS, 6.99 g of BPDA and 5.18 g of pyromellitic anhydride (hereinafter referred to simply as PMDA) were reacted in 158.67 g of NMP at room temperature for 12 hours, to obtain an NMP solution of a polyamic acid (7). The number average molecular weight was 20,500 as calculated as polyethylene oxide (the average of repeating units was about 36).

PREPARATION EXAMPLE 8

Preparation of Polyamic Acid Solution (8)

15.21 g of TFMB, 0.62 g of APDS and 10.14 g of PMDA were reacted in 147.16 g of NMP at room temperature for 12 hours, to obtain an NMP solution of a polyamic acid (8). The number average molecular weight was 19,500 as calculated as polyethylene oxide (the average of repeating units was about 36).

PREPARATION EXAMPLE 9

Preparation of Polyamic Acid Solution (9)

9.41 g of 4,4'-diaminodiphenylmethane (hereinafter referred to simply as DDM), 0.62 g of APDS and 21.32 g of 4,4'-hexafluoroisopropylidene diphthalic anhydride (hereinafter referred to simply as 6FDA) were reacted in 177.65 g of NMP at room temperature for 12 hours, to obtain an NMP solution of a polyamic acid (9). The number average molecular weight was 19,000 as calculated as polyethylene oxide (the average of repeating units was about 29).

EXAMPLE 1

1.80 g of the solvent-soluble polyimide resin (1) was dissolved in a solvent mixture comprising 7.83 g of ethyl lactate (hereinafter referred to simply as EL) and 11.47 g of NMP, and 8.00 g of the polyamic acid solution (6) was added and mixed to obtain a solution, to which 0.90 g of a photosensitive material prepared by a condensation reaction of 1 mol of 4,4'-[1-[4-[1-(4-hydroxyphenyl)-1-methylethyl] phenyl]ethylidene] with 2 mol of 1,2-naphthoquinone-2-diazido-5-sulfonyl chloride (P-200, manufactured by Toyo Gosei Kogyo Co., Ltd.) was added, followed by stirring at room temperature for 1 hour and then by filtration by means of a filter of 0.2 µm, to obtain a solution of a positive photosensitive polyimide resin composition.

This solution was directly coated on a silicon wafer by means of a spin coater and heated at 120° C. for two minutes on a hotplate to obtain a coating film having a thickness of about 1.0 µm. To this coating film, ultraviolet light was irradiated for 15 seconds through a test mask by means of an ultraviolet irradiation apparatus PLA-501 manufactured by Canon Inc. After the exposure, development was carried out by immersion for 45 seconds in a 2.38% TMAH aqueous solution (NMD-3, manufactured by Tokyo Ohka K.K.) at 23° C. The film thickness after the development was about 1.0 µm, whereby no film reduction was observed. The pattern resolution was such that the pattern was formed up to a line/space of 3 µm without peeling of the pattern.

This pattern was heated at a high temperature of 250° C. for 30 minutes in a circulating drying furnace, whereby the remaining film thickness ratio was 80%, and no substantial dimensional change of the pattern was observed.

Further, in the same manner as above, the coating film of the photosensitive polyimide resin composition formed on the silicon wafer was heated at a high temperature of 250° C. for 30 minutes in a circulating drying furnace and then immersed in pure water maintained at 23° C. for 24 hours. This coating film was measured by a thermogravimetric analyzer TG-DTA manufactured by MAC Science Co., Ltd., whereby the water absorption of the coating film was 2.2%.

EXAMPLE 2

A solution of a positive photosensitive polyimide resin composition was obtained in the same manner as in Example 1 except that the solvent-soluble polyimide resin (1) was changed to the solvent-soluble polyimide resin (2).

This solution was directly coated on a silicon wafer by means of a spin coater and heated at 120° C. for two minutes on a hotplate to obtain a coating film having a thickness of about 1.0 µm. To this coating film, ultraviolet light was irradiated for 15 seconds through a test mask by means of PLA-501. After the exposure, development was carried out by immersion in NMD-3 at 23° C. for 40 seconds. The film thickness after the development was about 1.0 µm, and no film reduction was observed. The pattern resolution was such that the pattern was formed up to a line/space of 3 µm without peeling of the pattern.

This pattern was heated at a high temperature of 250° C. for 30 minutes in a circulating drying furnace, whereby the remaining film thickness ratio was 80%, and the dimensional change of the pattern was a practical level. Further, the water absorption was measured in the same manner as in Example 1 and found to be 1.7%.

EXAMPLE 3

A solution of a positive photosensitive polyimide resin composition was obtained in the same manner as in Example 1 except that the polyamic acid solution (6) was changed to the polyamic acid solution (9).

This photosensitive polyimide solution was directly coated on a silicon wafer by means of a spin coater and heated at 120° C. for two minutes on a hotplate to obtain a coating film having a thickness of about 1.0 μm. To this coating film, ultraviolet light was irradiated for 15 seconds through a test mask by means of PLA-501. After the exposure, development was carried out by immersion in NMD-3 at 23° C. for 60 seconds. The film thickness after the development was about 1.0 μm, and no film reduction was observed. The pattern resolution was such that the pattern was formed up to a line/space of 5 μm without peeling of the pattern.

This pattern was heated at a high temperature of 250° C. for 30 minutes in a circulating drying furnace, whereby the remaining film thickness ratio was 82%, and the dimensional change of the pattern was a practical level. Further, the water absorption was measured in the same manner as in Example 1 and found to be 1.9%.

EXAMPLE 4

A solution of a positive photosensitive polyimide resin composition was obtained in the same manner as in Example 1 except that the solvent-soluble polyimide resin (1) was changed to the solvent-soluble polyimide resin (3), and the polyamic acid solution (6) was changed to the polyamic acid solution (7).

This photosensitive polyimide solution was directly coated on a silicon wafer and heated at 1200C for two minutes on a hotplate to obtain a coating film having a thickness of about 1.0 μm. To this coating film, ultraviolet light was irradiated for 15 seconds through a test mask by means of PLA-501. After the exposure, development was carried out by immersion in NMD-3 at 23° C. for 60 seconds. The film thickness after the development was about 1.0 μm, and no film reduction was observed. The pattern resolution was such that the pattern was formed up to a line/space of 3 μm without peeling of the pattern.

This pattern was heated at a high temperature of 250° C. for 30 minutes in a circulating drying furnace, whereby the remaining film thickness ratio was 80%, and the dimensional change of the pattern was a practical level. Further, the water absorption was measured in the same manner as in Example 1 and found to be 1.4%.

EXAMPLE 5

1.20 g of the solvent-soluble polyimide resin (4) was dissolved in a solvent mixture comprising 7.83 g of EL and 7.47 g of NMP, and 12.00 g of the polyamic acid solution (8) was further added and mixed to obtain a solution, to which 0.90 g of P-200 was added, followed by stirring at room temperature for 3 hour and then by filtration by means of a filter of 0.2 μm, to obtain a solution of a positive photosensitive polyimide resin composition.

This photosensitive polyimide solution was directly coated on a silicon wafer by means of a spin coater and heated at 120° C. for two minutes on a hotplate to obtain a coating film having a thickness of about 1.0 μm. To this coating film, ultraviolet light was irradiated for 15 seconds through a test mask by means of PLA-501. After the exposure, development was carried out by immersion in NMD-3 at 23° C. for 60 seconds. The film thickness after the development was about 1.0 μm, and no film reduction was observed. The pattern resolution was such that the pattern was formed up to a line/space of 5 μm without peeling of the pattern.

This pattern was heated at a high temperature of 250° C. for 30 minutes in a circulating drying furnace, whereby the remaining film thickness ratio was 78%, and the dimensional change of the pattern was a practical level. Further, the water absorption was measured in the same manner as in Example 1 and found to be 0.8%.

COMPARATIVE EXAMPLE 1

3 g of the solvent-soluble polyimide resin (2) was added and mixed to a solvent mixture comprising 7.83 g of EL and 18.27 g of NMP to obtain a solution, to which 0.90 g of P-200 was added, followed by stirring at room temperature for one hour and then by filtration by means of a filter of 0.2 μm, to obtain a solution of a positive photosensitive resin composition.

This photosensitive polyimide solution was directly coated on a silicon wafer by means of a spin coater and heated at 120° C. for 3 minutes on a hotplate to obtain a coating film having a thickness of about 1.0 μm. To this coating film, ultraviolet light was irradiated for 15 seconds through a test mask by means of PLA-501. After the exposure, development was carried out by immersion in NMD-3 at 23° C. for 180 seconds, but at the exposed area, the remaining film was observed, and a pattern was not obtained. Further, the water absorption was measured in the same manner as in Example 1 and found to be 1.9%.

COMPARATIVE EXAMPLE 2

To 20.00 g of the polyamic acid solution (6), 7.83 g of EL and 1.27 g of NMP were added and mixed to obtain a solution, to which 0.90 g of P-200 was added, followed by stirring at room temperature for one hour and then by filtration by means of a filter of 0.2 μm, to obtain a solution of a positive photosensitive resin composition.

This photosensitive polyimide solution was directly coated on a silicon wafer by means of a spin coater and heated at 120° C. for two minutes on a hotplate to obtain a coating film having a thickness of about 1.0 μm. To this coating film, ultraviolet light was irradiated for 15 seconds through a test mask by means of PLA-501. After the exposure, development was carried out by immersion in NMD-3 at 23° C. for 20 seconds, whereby unexposed area was also dissolved, and a pattern was not obtained. Further, the water absorption was measured in the same manner as in Example 1 and found to be 0.8%.

COMPARATIVE EXAMPLE 3

3 g of the solvent-soluble polyimide resin (5) was added and mixed to a solvent mixture comprising 17.55 g of γ-butyrolactone and 17.55 g of NMP to obtain a solution, to which 0.90 g of a photosensitive material prepared by a condensation reaction of 1 mol of 2,3,4,4'-tetrahydroxybenzophenone with 3 mol of 1,2-naphthoquinone-2-diazido-5-sulfonyl chloride (4NT-300, manufactured by Toyo Gosei Kogyo Co., Ltd.) was added, followed by stirring at room temperature for one hour and then by filtration by means of a filter of 0.2 μm, to obtain a solution of a positive photosensitive resin composition.

This photosensitive polyimide solution was directly coated on a silicon wafer by means of a spin coater and heated at 120° C. for 3 minutes on a hotplate to obtain a coating film having a thickness of about 1.0 μm. To this coating film, ultraviolet light was irradiated for 35 seconds through a test mask by means of PLA-501. After the exposure, development was carried out by immersion in NMD-3 at 23° C. for 150 seconds. The film thickness after the development was about 0.97 μm, and the film reduction was slight. However, peeling of the pattern was observed with a line/space being 30 μm or less.

This pattern was heated at a high temperature of 250° C. for 30 minutes in a circulating drying furnace, whereby the remaining film thickness ratio was 82%, and the dimensional change of the pattern was a practical level. Further, the water absorption was measured in the same manner as in Example 1 and found to be at least 3%.

COMPARATIVE EXAMPLE 4

1.80 g of the solvent-soluble polyimide resin (5) was dissolved in a solvent mixture comprising 7.55 g of γ-butyrolactone and 10.75 g of NMP, and 8.00 g of the polyamic acid solution (6) was further added and mixed to obtain a solution, to which 0.90 g of P-200 was added, followed by stirring at room temperature for one hour and then by filtration by means of a filter of 0.2 μm, to obtain a solution of a positive photosensitive polyimide resin composition.

This photosensitive polyimide solution was directly coated on a silicon wafer by means of a spin coater and heated at 120° C. for 3 minutes on a hotplate, whereby it was possible only to obtain a coating film having a non-uniform surface with a turbid appearance.

TABLE 1

| | Polyimide component | Weight ratio (%) | Polyamic acid component | Weight ratio (%) | Photo-sensitive material * |
|---|---|---|---|---|---|
| Ex. 1 | (1) | 60 | (6) | 40 | P-200 |
| 2 | (2) | 60 | (6) | 40 | P-200 |
| 3 | (1) | 60 | (9) | 40 | P-200 |
| 4 | (3) | 60 | (7) | 40 | P-200 |
| 5 | (4) | 40 | (8) | 60 | P-200 |
| Comp. Ex. 1 | (2) | 100 | — | 0 | P-200 |
| 2 | — | 0 | (6) | 100 | P-200 |
| 3 | (5) | 100 | — | 0 | 4NT-300 |
| 4 | (5) | 60 | (6) | 40 | P-200 |

* The photosensitive material was added in an amount of 30 parts by weight per 100 parts by weight of the total of the polyimide and the polyamic acid.

TABLE 2

| | Exposure time (sec) | Development time (sec) | Film thickness after development (μm) | Resolution (μm) | Water absorption (%) |
|---|---|---|---|---|---|
| Ex. 1 | 15 | 45 | 1.0 | 3 | 2.2 |
| 2 | 15 | 40 | 1.0 | 3 | 1.7 |
| 3 | 15 | 60 | 1.0 | 3 | 1.9 |
| 4 | 15 | 60 | 1.0 | 3 | 1.4 |
| 5 | 15 | 60 | 1.0 | 5 | 0.8 |
| Comp. Ex. 1 | 40 | >180 | 1.0 | Remaining film | 1.9 |
| 2 | 15 | 0 | 0 | — | 0.8 |
| 3 | 35 | 150 | 0.97 | >30 | >3 |
| 4 | Impossible to obtain a uniform coating film. | | | | |

INDUSTRIAL APPLICABILITY

According to the present invention, it is possible to obtain a positive photosensitive resin composition which presents a pattern having a high dimensional stability after curing without film reduction, swelling or peeling at the time of development with an aqueous alkaline solution and of which the final cured film has a low water absorption and is excellent in alkaline resistance.

The positive photosensitive polyimide resin composition of the present invention is used not only for an interlayer insulating film for a semiconductor device, a passivation film, a buffer coating film, an insulating film for a multilayer printed circuit board, etc., but also for a protective film for a thin film transistor of a liquid crystal display device, a protective film for electrodes for an inorganic EL device, etc.

The invention claimed is:

1. A positive photosensitive polyimide resin composition, comprising:
100 parts by weight of an organic solvent-soluble polyimide having repeating units represented by the formula (1):

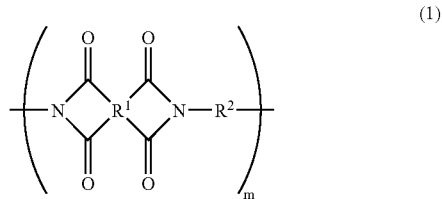

wherein m is an integer of from 3 to 10,000, $R^1$ is a tetravalent organic group, $R^2$ is a bivalent organic group, provided that from 5 to 100 mol % of $R^2$ is a bivalent organic group having fluorine),
5 to 400 parts by weight of a polyamic acid having repeating units represented by the formula (2):

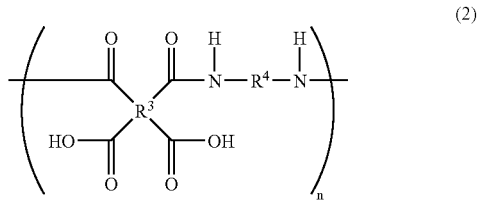

wherein n is an integer of from 3 to 10,000, $R^3$ is a tetravalent organic group, and $R^4$ is a bivalent organic group), and a compound capable of generating an acid by irradiation with light.

2. The positive photosensitive polyimide resin composition according to claim 1, wherein in the solvent-soluble polyimide having repeating units represented by the formula (1), from 90 to 100 mol % of $R^2$ is a bivalent organic group having no acidic group.

3. The positive photosensitive polyimide resin composition according to claim 1, wherein the solvent-soluble polyimide having repeating units represented by the formula (1) is a solvent-soluble polyimide having a dissolution rate of at least 0.1 μm/min in a 2.38 wt % tetramethylammonium hydroxide aqueous solution at 23° C.

4. The positive photosensitive polyimide resin composition according to claim 2, wherein the solvent-soluble polyimide having repeating units represented by the formula (1) is a solvent-soluble polyimide having a dissolution rate of at least 0.1 μm/min in a 2.38 wt % tetramethylammonium hydroxide aqueous solution at 23° C.

5. The positive photosensitive polyimide resin composition according to claim 1, wherein in the solvent-soluble polyimide having repeating units represented by the formula (1), the four carbonyl groups bonded to $R^1$ are not directly bonded to an aromatic ring, or $R^1$ is a tetravalent organic group constituting an aromatic tetracarboxylic acid having fluorine.

6. The positive photosensitive polyimide resin composition according to claim 4, wherein in the solvent-soluble polyimide having repeating units represented by the formula (1), the four carbonyl groups bonded to $R^1$ are not directly bonded to an aromatic ring, or $R^1$ is a tetravalent organic group constituting an aromatic tetracarboxylic acid having fluorine.

7. The positive photosensitive polyimide resin composition according to claim 1, which contains from 10 to 400 parts by weight of the polyamic acid having repeating units represented by the formula (2) per 100 parts by weight of the solvent-soluble polyimide resin having repeating units represented by the formula (1) and which contains from 1 to 50 parts by weight of the compound capable of generating an acid by irradiation with light per 100 parts by weight of the total amount of repeating units represented by the formula (1) and repeating units represented by the formula (2).

8. The positive photosensitive polyimide resin composition according to claim 6, which contains from 10 to 400 parts by weight of the polyamic acid having repeating units represented by the formula (2) per 100 parts by weight of the solvent-soluble polyimide resin having repeating units represented by the formula (1) and which contains from 1 to 50 parts by weight of the compound capable of generating an acid by irradiation with light per 100 parts by weight of the total amount of repeating units represented by the formula (1) and repeating units represented by the formula (2).

9. The positive photosensitive polyimide resin composition according to claim 1, wherein the compound capable of generating an acid by irradiation with light is at least one compound selected from the group consisting of a 1,2-naphthoquinonediazido-4-sulfonic acid ester, a 1,2-naphthoquinonediazido-5-sulfonic acid ester, a 1,2-naphthoquinonediazido-6-sulfonic acid ester, a 1,2-naphthoquinonediazido-4-sulfonamide, a 1,2-naphthoquinonediazido-5-sulfonamide, and a 1,2-naphthoquinonediazido-6-sulfonamide.

10. The positive photosensitive polyimide resin composition according to claim 8, wherein the compound capable of generating an acid by irradiation with light is at least one compound selected from the group consisting of a 1,2-naphthoquinonediazido-4-sulfonic acid ester, a 1,2-naphthoquinonediazido-5-sulfonic acid ester, a 1,2-naphthoquinonediazido-6-sulfonic acid ester, a 1,2-naphthoquinonediazido-4-sulfonamide, a 1,2-naphthoquinonediazido-5-sulfonamide, and a 1,2-naphthoquinonediazido-6-sulfonamide.

11. A solution having the positive photosensitive polyimide resin composition as defined in claim 1 dissolved in an organic solvent at a concentration of from 1 to 50 wt %.

12. A solution having the positive photosensitive polyimide resin composition as defined in claim 8 dissolved in an organic solvent at a concentration of from 1 to 50 wt %.

13. A cured film obtained by coating and drying the solution as defined in claim 11 on a substrate.

14. A cured film obtained by coating and drying the solution as defined in claim 12 on a substrate.

15. The positive photosensitive polyimide resin composition according to claim 1, which comprises from 5 to 400 parts by weight of the polyamic acid having repeating units represented by the fonnula (2) per 100 parts by weight of the solvent-soluble polyimide resin having repeating units represented by the formula (1).

16. The positive photosensitive polyimide resin composition according to claim 1, which comprises from 50 to 200 parts by weight of the polyamic acid having repeating units represented by the formula (2) per 100 parts by weight of the solvent-soluble polyimide resin having repeating units represented by the formula (1).

17. A semiconductor element comprising an interlayer insulating film which comprises the positive photosensitive polyimide resin composition of claim 1.

18. A multilayer printed circuit board, which comprises a passivation film, a buffer coating film, or an insulating film; wherein at least one of the passivation film, the buffer coating film, or the insulating film comprises the positive photosensitive polyimide resin composition of claim 1.

19. In an organic EL device which comprises an electrode and a protective film for said electrode, the improvement comprises: said protective film comprises the positive photosensitive polyimide resin composition of claim 1.

20. In a liquid crystal display device which comprises a thin film transistor and a protective film for said thin film transistor, the improvement comprises: said protective film comprises the positive photosensitive polyimide resin composition of claim 1.

* * * * *